US012488984B2

(12) United States Patent
Tien et al.

(10) Patent No.: US 12,488,984 B2
(45) Date of Patent: Dec. 2, 2025

(54) PLASMA-ASSISTED ANNEALING SYSTEM AND METHOD

(71) Applicant: METAL INDUSTRIES RESEARCH & DEVELOPMENT CENTRE, Kaohsiung (TW)

(72) Inventors: Wei-Chen Tien, Chiayi (TW); Cheng-Yuan Hung, Kaohsiung (TW); Chang-Sin Ye, Tainan (TW); Chun-Kai Huang, Kaohsiung (TW); Yii-Der Wu, Kaohsiung (TW)

(73) Assignee: METAL INDUSTRIES RESEARCH & DEVELOPMENT CENTRE, Kaohsiung (TW)

( * ) Notice: Subject to any disclaimer, the term of this patent is extended or adjusted under 35 U.S.C. 154(b) by 604 days.

(21) Appl. No.: 18/079,069

(22) Filed: Dec. 12, 2022

(65) Prior Publication Data

US 2024/0079230 A1 Mar. 7, 2024

(30) Foreign Application Priority Data

Sep. 1, 2022 (TW) .................................. 111133258

(51) Int. Cl.
*H01L 21/02* (2006.01)
*H01J 37/32* (2006.01)

(52) U.S. Cl.
CPC .... *H01L 21/0234* (2013.01); *H01J 37/32449* (2013.01); *H01J 37/32522* (2013.01); *H01J 37/32834* (2013.01); *H01L 21/02178* (2013.01)

(58) Field of Classification Search
CPC ........... H01L 21/0234; H01L 21/02178; H01L 21/67017; H01L 21/67109; H01J 37/32449; H01J 37/32522; H01J 37/32834; H01J 37/32724; F27B 17/00; F27D 19/00
See application file for complete search history.

(56) References Cited

U.S. PATENT DOCUMENTS

2003/0173072 A1 9/2003 Vinegar et al.
2006/0030165 A1 2/2006 Ingle et al.

FOREIGN PATENT DOCUMENTS

CN 104521046 A 4/2015
TW 200903718 A 1/2009
TW 201250791 A 12/2012
TW M636106 U 1/2023

OTHER PUBLICATIONS

Taiwanese Office Action mailed May 10, 2023 for Taiwanese Patent Application No. 111133258, 7 pages.

*Primary Examiner* — Robert G Bachner
(74) *Attorney, Agent, or Firm* — Demian K. Jackson; Jackson IPG PLLC

(57) ABSTRACT

A plasma-assisted annealing system includes a high temperature furnace, a plasma-induced dissociator and a connecting duct. The plasma-induced dissociator is provided to dissociate a working gas and exhaust the dissociated working gas from its working gas outlet. Both ends of the connecting duct are connected to the working gas outlet of the plasma-induced dissociator and a gas inlet of the high temperature furnace, respectively. The working gas dissociated in the plasma-induced dissociator is introduced into the high temperature furnace via the connecting duct.

10 Claims, 3 Drawing Sheets

PLASMA-ASSISTED ANNEALING SYSTEM AND METHOD

FIELD OF THE INVENTION

This invention relates to an annealing system and method, and more particularly to a plasma-assisted annealing system and method.

BACKGROUND OF THE INVENTION

Metallic thin film has been treated by high temperature annealing for years to improve film quality in semiconductor manufacture. Generally, the metallic thin film is heated to a temperature higher than its recrystallization temperature, the treatment temperature is kept constant for a period of time and reduced gradually to improve crystallinity of the metallic thin film effectively and further improve electric property of the metallic thin film. However, the metallic thin film has to be heated to a high temperature and kept constant for a longer period of time in the conventional annealing treatment. Power consumption of the conventional annealing treatment is quite huge, but crystallinity improvement of the metallic thin film is limited.

SUMMARY

One object of the present invention is to provide a working gas dissociated by a plasma-induced dissociator to assist annealing treatment and further improve crystal quality of a metal compound film.

A plasma-assisted annealing system includes a high temperature furnace, a plasma-induced dissociator and a connecting duct. The plasma-induced dissociator is provided to dissociate a working gas and exhaust a dissociated working gas from its working gas outlet. The working gas outlet of the plasma-induced dissociator and a gas inlet of the high temperature furnace are connected by the connecting duct. The working gas dissociated in the plasma-induced dissociator is introduced into the high temperature furnace via the connecting duct.

A plasma-assisted annealing method includes the steps of: introducing a working gas into a high temperature furnace via a connecting duct by a plasma-induced dissociator, both ends of the connecting duct are connected to a working gas outlet of the plasma-induced dissociator and a gas inlet of the high temperature furnace, respectively; dissociating the working gas and introducing a dissociated working gas into the high temperature furnace via the connecting duct by the plasma-induced dissociator; and increasing a temperature of the high temperature furnace to anneal an object to be processed which is placed in the high temperature furnace.

In the present invention, the connecting duct is provided to connect the plasma-induced dissociator and the high temperature so as to allow plasma-induced dissociation and annealing treatment to be executed in different chambers. The annealing treatment is assisted with the dissociated working gas, and furthermore, the annealing temperature is not affected by the high plasma temperature.

DETAILED DESCRIPTION OF THE INVENTION

Figure 1:
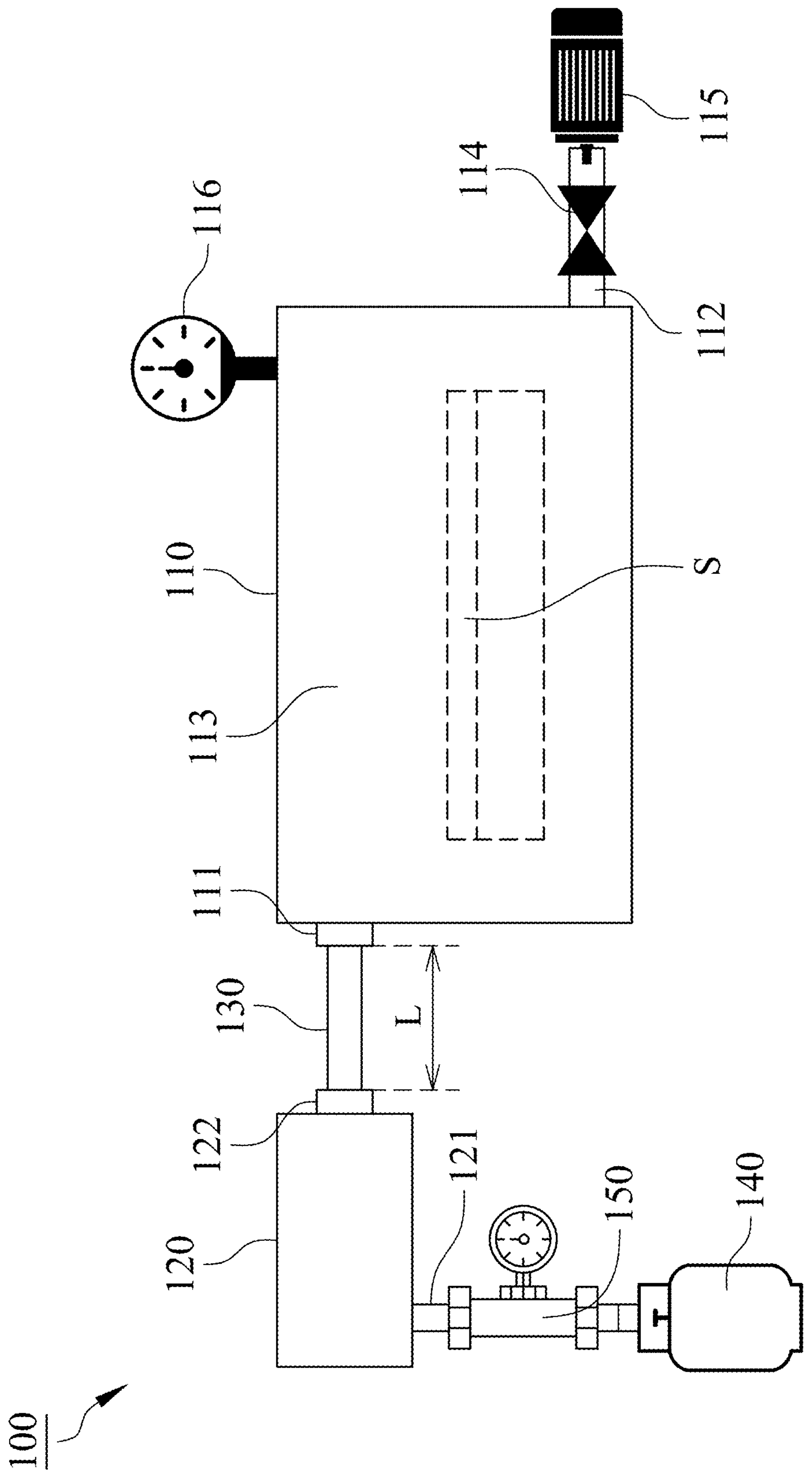
FIG. 1 is a diagram illustrating a plasma-assisted annealing system in accordance with one embodiment of the present invention.

A plasma-assisted annealing system 100 in accordance with one embodiment of the present invention is shown in FIG. 1. In this embodiment, the plasma-assisted annealing system 100 includes a high temperature furnace 110, a plasma-induced dissociator 120, a connecting duct 130, a gas supplier 140 and a flow controller 150.

The high temperature furnace 110 includes a gas inlet 111, a gas outlet 112 and a chamber 113, the gas inlet 111 communicates with the chamber 113 and is provided to introduce air into the chamber 113, and the gas outlet 112 communicates with the chamber 113 and is provided to direct air out of the chamber 113. The plasma-induced dissociator 120 includes a working gas inlet 121 and a working gas outlet 122. The working gas inlet 121 is connected to one end of the flow controller 150, the working gas outlet 122 is connected to one end of the connecting duct 130, the other end of the flow controller 150 is connected to the gas supplier 140, and the other end of the connecting duct 130 is connected to the gas inlet 111 of the high temperature furnace 110.

Owing to the gas supplier 140, the flow controller 150, the plasma-induced dissociator 120, the connecting duct 130 and the chamber 113 of the high temperature furnace 110 communicate mutually as mentioned above, a working gas supplied by the gas supplier 140 can flow to the chamber 113 of the high temperature furnace 110 via the flow controller 150, the plasma-induced dissociator 120 and the connecting duct 130 while the gas supplier 140 and the flow controller 150 are turned on. The gas supplier 140 may be a gas cylinder with the compressed working gas, and the flow controller 150 can control the flow mass of the working gas flowing into the plasma-induced dissociator 120 while the gas cylinder is opened.

Preferably, the high temperature furnace 110 further includes a pressure control valve 114, an air extractor 115 and a pressure gauge 116. Both ends of the pressure control valve 114 are connected to the gas outlet 112 of the high temperature furnace 110 and the air extractor 115, respectively, thus the air extractor 115 can exhaust the gas in the chamber 113 via the pressure control valve 114. The pressure control valve 114 is used to control a flow mass of the gas exhausted by the air extractor 115 to maintain the pressure in the chamber 113 as the working gas is supplied into the chamber 113 by the gas supplier 140. Because of the pressure gauge 160, the pressure in the chamber 113 can be real-time monitored to ensure appropriate pressure level in the chamber 113.

When the plasma-induced dissociator 120 is operated to generate plasma, the working gas passing through the plasma-induced dissociator 120 is dissociated. And owing to the gas in the chamber 113 is exhausted by the air extractor 115, the working gas dissociated in the plasma-induced dissociator 120 can be exhausted from the working gas outlet 112, guided into the chamber 113 via the connecting duct 130 and the gas inlet 111, and exhausted by the air extractor 150.

The chamber 113 is heated to increase its temperature by the high temperature furnace 110 during an annealing treatment of an object to be processed S which is placed in the chamber 113. The chamber 113 is heated by a heater (not shown, such as heating rod) in the high temperature furnace 110. In this embodiment, the object to be processed S is a metal compound film such as GaN film, AlN film or AlGaN film, and annealed to increase its crystallinity and electric property. In this embodiment, the plasma-induced dissociator 120 continuously introduces the dissociated working gas into the high temperature furnace 110 during the annealing treatment, as a result, the object to be processed S can be annealed in the atmosphere of the dissociated working gas to reduce defect density of the metal compound film and enhance crystal quality of the metal compound film. The working gas is selected based on the material of the object to be processed S, for example, the working gas may be nitrogen, TMA, ammonia or combination thereof provided to improve crystal bonding and crystallinity when the object to be processed S is a metal nitride thin film. The type of the working gas and the material made of the object to be processed S are not limited in the present invention.

With reference to FIG. 1, both ends of the connecting duct 130 are provided to connect the plasma-induced dissociator 120 and the high temperature furnace 110 in this embodiment, accordingly, plasma-induced dissociation and annealing treatment can be implemented in different chambers. Not only to anneal the object to be processed S with the assistance of the dissociated working gas, but also to prevent the annealing temperature applied on the object to be processed S from being affected by the high plasma temperature, thus crystal quality of the object to be processed S is stable. Preferably, the connecting duct 130 has a length L between 5 cm and 50 cm so as to ensure the dissociated working gas can be introduced into the chamber 113 stably without the possibility that the annealing temperature is varied by the high plasma temperature.

Figure 2:
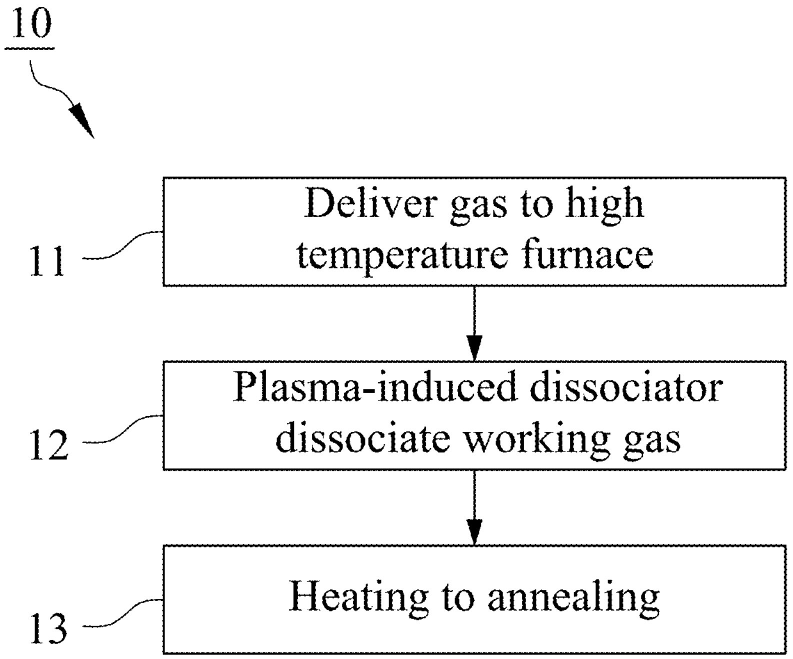
FIG. 2 is a flowchart illustrating a plasma-assisted annealing method in accordance with one embodiment of the present invention.

FIG. 2 is a flowchart illustrating a plasma-assisted annealing method using the plasma-assisted annealing system 100 mentioned previously. With reference to FIGS. 1 and 2, in the step 11, the gas supplier 140, the flow controller 150 and the air extractor 115 are turned on to allow the working gas in the gas supplier 140 to flow to the chamber 113 of the high temperature furnace 110 via the flow controller 150 and the plasma-induced dissociator 120, and the flow controller 150 and the pressure control valve 114 are adjusted simultaneously to maintain the pressure of the chamber 113 constant. In this embodiment, the object to be processed S is a metal nitride thin film, the working gas is nitrogen, the flow of the working gas introduced into the plasma-induced dissociator 120 is kept constant at 1 L/min by the flow controller 150, and the pressure of the chamber 113 is kept within a range between 500 torr and 0.1 torr by the pressure control valve 114.

Next, the plasma-induced dissociator 120 is turned on in the step 12 to dissociate the working gas passing through the plasma-induced dissociator 120, and the dissociated working gas is introduced into the chamber 113 via the connecting duct 130. In this embodiment, the power of the plasma-induced dissociator 120 is between 0.1 kW and 5 kW, and the radio frequency of the plasma-induced dissociator 120 is between 100 kHz and 40 MHz.

In the final step 13, the high temperature furnace 110 is heated to increase its temperature, and the temperature of the high temperature furnace 110 is kept high enough for a sufficient time for annealing the object to be processed S. In this embodiment, the object to be processed S is annealed for one hour at 800° C.

Figure 3:
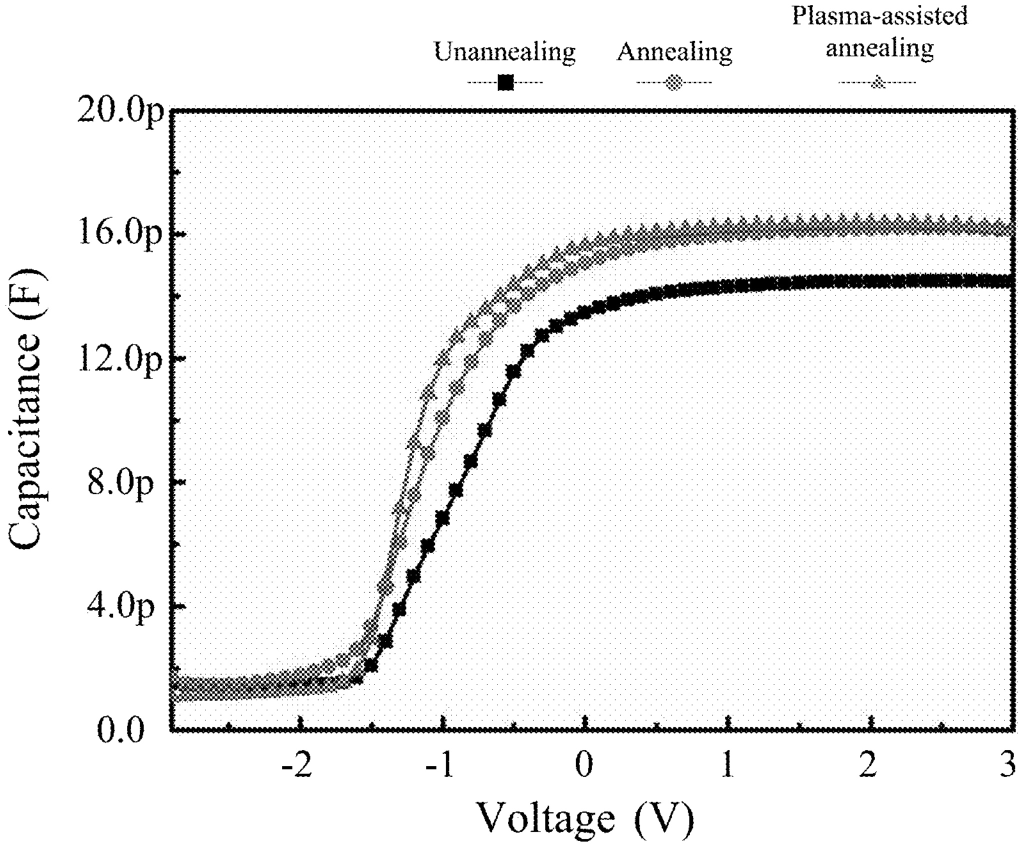
FIG. 3 is a capacitance-voltage (CV) characteristic curve of AlN thin films processed by a plasma-assisted annealing method in accordance with one embodiment of the present invention, a conventional annealing method and without annealing.

FIG. 3 is a capacitance-voltage (CV) characteristic curve of an object processed using the plasma-assisted annealing method of this embodiment, processed using a conventional annealing method and without annealing. The object to be processed is an aluminum nitride (AlN) thin film generated by plasma-enhanced atomic layer deposition. As shown in the CV characteristic curve, the AlN thin film processed by the plasma-assisted annealing method of this embodiment has a significantly greater slope in depletion region than those processed by the conventional annealing method and without annealing. The greater the slope in depletion region, the faster the component switching speed, thus the AlN thin film processed using the plasma-assisted annealing method of this embodiment of the present invention has significantly improved crystal quality.

Because of the connecting duct 130, plasma-induced dissociation and annealing treatment can be executed in difference chambers, and the annealing temperature applied on the object to be processed S during the annealing treatment is not changed by the plasma temperature in the plasma-induced dissociator 120. Moreover, the annealing treatment assisted by the dissociated working gas can lower defect density of the metal compound film and improve crystal quality of the metal compound film.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A plasma-assisted annealing system comprising:

a high temperature furnace including a gas inlet;

a plasma-induced dissociator including a working gas outlet, configured to dissociate a working gas and configured to exhaust a dissociated working gas from the working gas outlet; and a connecting duct, both ends of the connecting duct are connected to the working gas outlet of the plasma-induced dissociator and the gas inlet of the high temperature furnace respectively, wherein the dissociated working gas in the plasma-induced dissociator is configured to be introduced into the high temperature furnace via the connecting duct.

2. The plasma-assisted annealing system in accordance with claim 1, wherein the connecting duct has a length between 5 cm and 50 cm.

3. The plasma-assisted annealing system in accordance with claim 1 further comprising a gas supplier and a flow controller, wherein both ends of the flow controller are connected to the gas supplier and a working gas inlet of the plasma-induced dissociator respectively, the gas supplier is configured to supply the working gas, and the flow controller is configured to control a flow mass of the working gas flowing from the gas supplier to the plasma-induced dissociator.

4. The plasma-assisted annealing system in accordance with claim 1, wherein the high temperature furnace further includes a chamber and a gas outlet, the gas inlet communicates with the chamber and is configured to allow the working gas or the dissociated working gas to be introduced into the chamber, the chamber is configured to accommodate an object to be processed, the gas outlet communicates with the chamber and configured to allow the working gas or the dissociated working gas in the chamber to be exhausted, the object to be processed is a metal compound film.

5. The plasma-assisted annealing system in accordance with claim 4, wherein the high temperature furnace further includes a pressure control valve and an air extractor, both ends of the pressure control valve are connected to the gas outlet of the high temperature furnace and the air extractor, the air extractor is configured to exhaust the working gas or the dissociated working gas in the chamber via the pressure control valve, the pressure control valve is configured to control a flow mass of the working gas or the dissociated working gas exhausted by the air extractor.

6. A plasma-assisted annealing method comprising the steps of:

introducing a working gas into a high temperature furnace via a connecting duct by a plasma-induced dissociator, both ends of the connecting duct are connected to a working gas outlet of the plasma-induced dissociator and a gas inlet of the high temperature furnace, respectively;

dissociating the working gas and introducing a dissociated working gas into the high temperature furnace via the connecting duct by the plasma-induced dissociator; and increasing a temperature of the high temperature furnace to anneal an object to be processed which is placed in the high temperature furnace.

7. The plasma-assisted annealing method in accordance with claim 6, wherein the connecting duct has a length between 5 cm and 50 cm.

8. The plasma-assisted annealing method in accordance with claim 6, wherein both ends of a flow controller are connected to a gas supplier and a working gas inlet of the plasma-induced dissociator respectively, the gas supplier is configured to supply the working gas, and the flow controller is configured to control a flow mass of the working gas flowing from the gas supplier to the plasma-induced dissociator.

9. The plasma-assisted annealing method in accordance with claim 6, wherein the high temperature furnace includes a chamber and a gas outlet, the gas inlet communicates with the chamber and is configured to allow the working gas or the dissociated working gas to be introduced into the chamber, the chamber is configured to accommodate the object to be processed, the gas outlet communicates with the chamber and configured to allow the working gas or the dissociated working gas in the chamber to be exhausted, the object to be processed is a metal compound film.

10. The plasma-assisted annealing method in accordance with claim 9, wherein the high temperature furnace further includes a pressure control valve and an air extractor, both ends of the pressure control valve are connected to the gas outlet of the high temperature furnace and the air extractor, the air extractor is configured to exhaust the working gas or the dissociated working gas in the chamber via the pressure control valve, the pressure control valve is configured to control a flow mass of the working gas or the dissociated working gas exhausted by the air extractor.

* * * * *